(12) United States Patent
Chan et al.

(10) Patent No.: US 8,315,052 B2
(45) Date of Patent: Nov. 20, 2012

(54) SERVER CABINET AND SERVER SYSTEM UTILIZING THE SAME

(75) Inventors: Hung-Chou Chan, Taipei Hsien (TW); Zhen-Xing Ye, Shenzhen (CN); Xian-Guang Tan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 201 days.

(21) Appl. No.: 12/981,568

(22) Filed: Dec. 30, 2010

(65) Prior Publication Data

US 2012/0134111 A1  May 31, 2012

(30) Foreign Application Priority Data

Nov. 25, 2010  (CN) .......................... 2010 1 0559115

(51) Int. Cl.
*H05K 7/20* (2006.01)
(52) U.S. Cl. .............. 361/695; 361/679.46; 361/679.48; 361/679.5; 361/690; 361/692; 361/724; 312/223.2; 312/223.3; 312/236; 312/265.5; 312/235.1; 165/121; 165/122; 165/126; 165/185
(58) Field of Classification Search .............. 361/679.46–679.51, 690–697, 361/688, 689, 715–728; 165/121–126, 80.2, 165/80.3, 104.33, 185; 312/223.2, 223.3, 312/235.1, 236, 265.5; 454/184; 174/50, 174/520
See application file for complete search history.

(56) References Cited

U.S. PATENT DOCUMENTS

| | | | | |
|---|---|---|---|---|
| 6,643,123 | B2 * | 11/2003 | Hartel et al. | 361/678 |
| 6,738,255 | B2 * | 5/2004 | Chen | 361/679.02 |
| 7,182,208 | B2 * | 2/2007 | Tachibana | 211/26 |
| 7,312,397 | B1 * | 12/2007 | Chen | 174/66 |
| 7,438,638 | B2 * | 10/2008 | Lewis et al. | 454/184 |
| 7,508,663 | B2 * | 3/2009 | Coglitore | 361/695 |
| 7,839,637 | B2 * | 11/2010 | Pakravan | 361/695 |
| 7,909,902 | B2 * | 3/2011 | Eckberg et al. | 55/385.6 |
| 7,983,038 | B2 * | 7/2011 | Levesque et al. | 361/692 |
| 8,018,724 | B2 * | 9/2011 | Jian | 361/724 |
| 8,035,970 | B2 * | 10/2011 | Schott | 361/695 |
| 8,077,455 | B2 * | 12/2011 | Jian | 361/679.48 |
| 8,130,494 | B2 * | 3/2012 | Larsen et al. | 361/690 |
| 2007/0211439 | A1 * | 9/2007 | Shimizu | 361/724 |
| 2009/0129014 | A1 * | 5/2009 | Larsen et al. | 361/692 |
| 2011/0063793 | A1 * | 3/2011 | Chen et al. | 361/679.46 |
| 2011/0069436 | A1 * | 3/2011 | Jian | 361/679.02 |
| 2011/0096485 | A1 * | 4/2011 | Jian | 361/679.4 |
| 2012/0134103 | A1 * | 5/2012 | Tan | 361/679.46 |
| 2012/0134110 | A1 * | 5/2012 | Chang | 361/695 |
| 2012/0162904 | A1 * | 6/2012 | Chan et al. | 361/679.48 |

\* cited by examiner

*Primary Examiner* — Michail V Datskovskiy
(74) *Attorney, Agent, or Firm* — Altis Law Group, Inc.

(57) ABSTRACT

A server cabinet adapted for receiving servers therein includes a top plate, a bottom plate opposite to the top plate, a left side plate and a right side plate connecting with the top and bottom plates respectively, and a front side plate disposed between the top and bottom plates. The front side plate defines through holes therein. A total area of the through holes in an upper half portion of the front side plate is different from a total area of the through holes in a lower half portion of the front side plate. The front side plate is rotatable in a plane defined by the front side plate.

20 Claims, 5 Drawing Sheets

SERVER CABINET AND SERVER SYSTEM UTILIZING THE SAME

BACKGROUND

1. Technical Field

The disclosure relates to server cabinets for use in server systems, and more particularly to a server cabinet facilitating heat dissipation.

2. Description of Related Art

Nowadays, numerous server systems are used for data storage and data operation. A server system generally includes a server cabinet, and a number of standard servers stacked in the server cabinet one on another along a height direction of the server cabinet. The servers generate considerable heat during operation, and may suffer damage if the heat is not efficiently removed.

What is needed, therefore, is a server cabinet for use in a server system which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
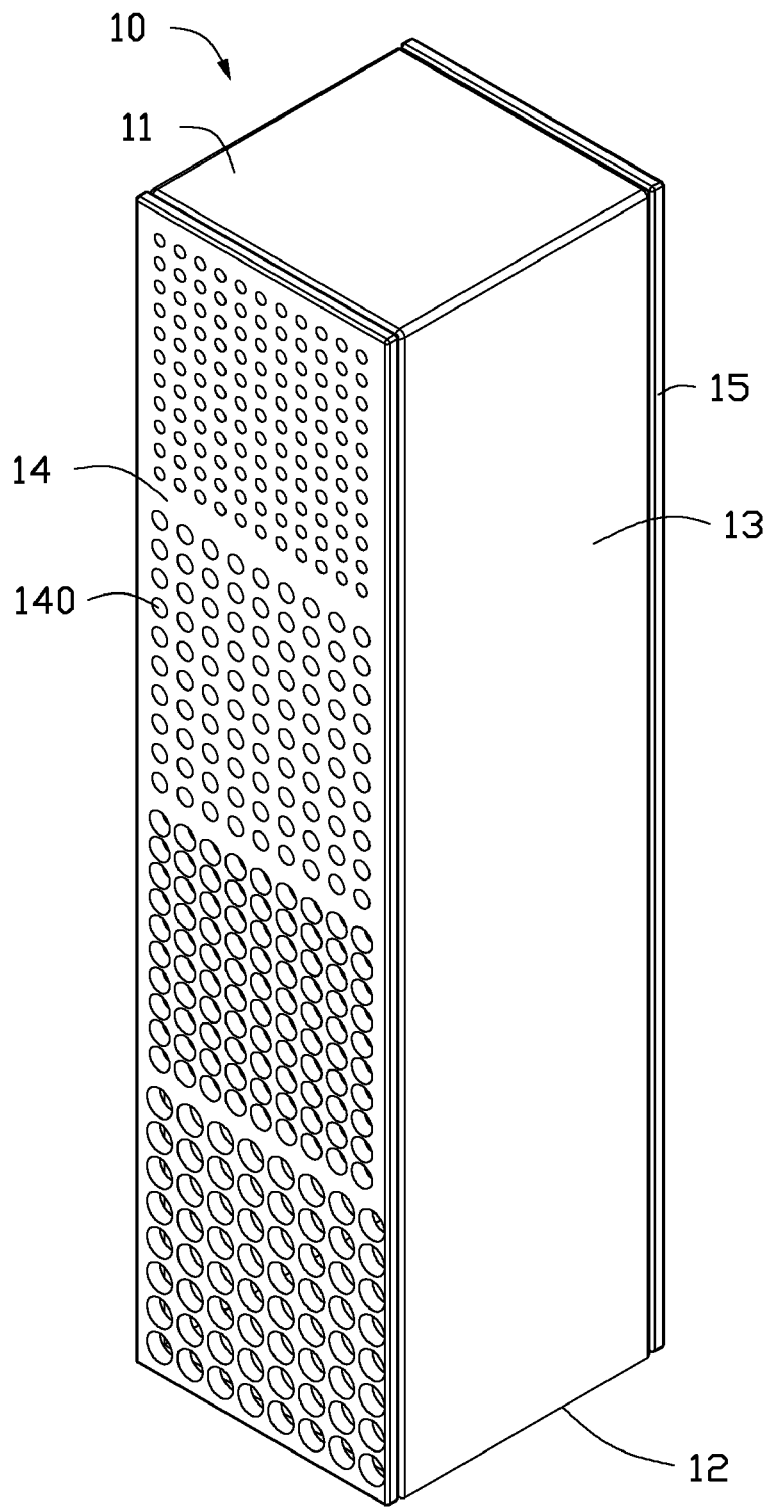
FIG. 1 is an isometric, assembled view of a server cabinet of a server system in accordance with a first embodiment of the disclosure.
Figure 4:
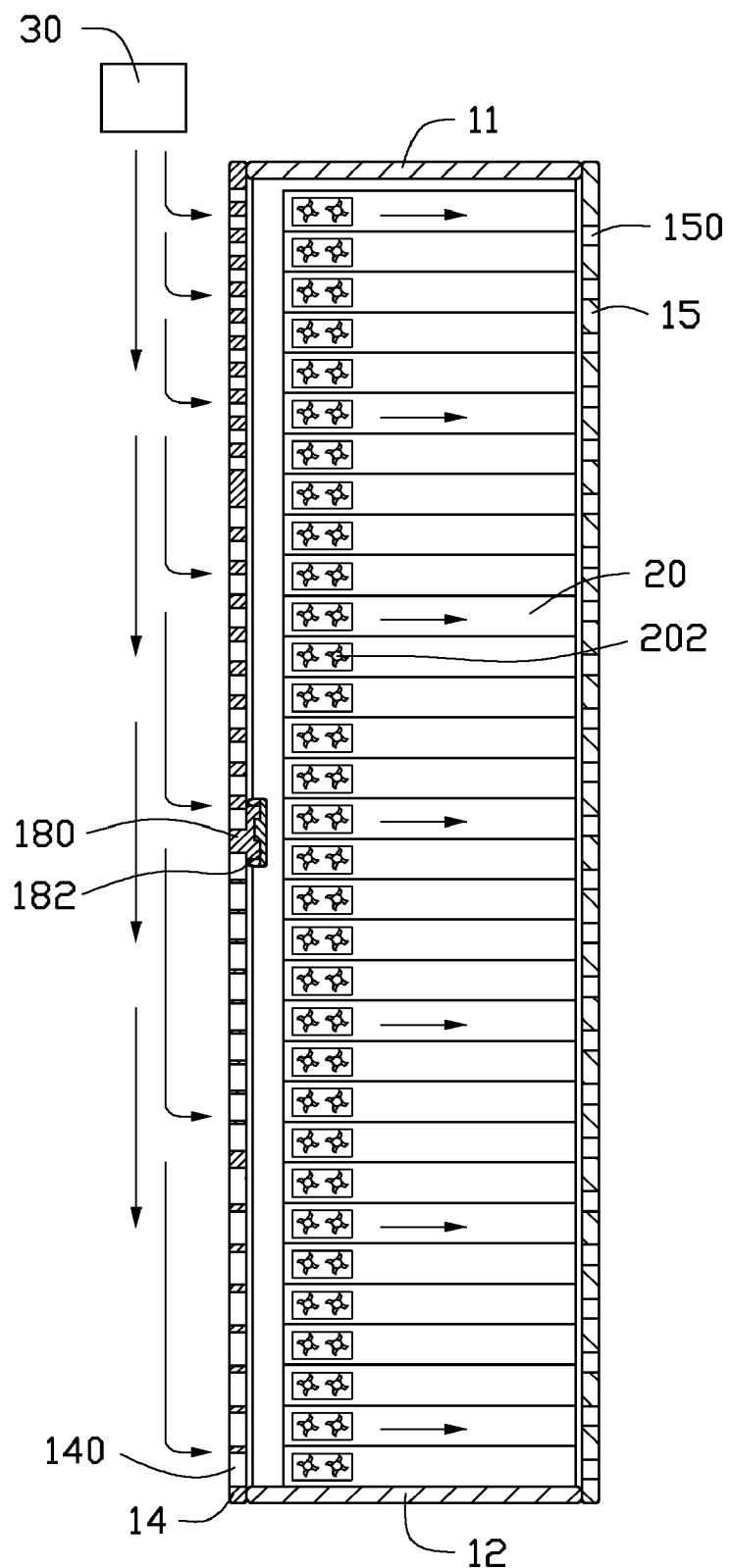
FIG. 4 is a cross sectional view of the server cabinet of FIG. 1, and showing an airflow generating device of the server system disposed at a top of the server cabinet.

Referring to FIGS. 1 and 4, a server system in accordance with a first embodiment of the disclosure is shown. The server system includes a server cabinet 10, a plurality of standard servers 20 stacked in the server cabinet 10, and an airflow generating device 30 disposed near a top end of the server cabinet 10. The airflow generating device 30 is for generating airflow, and can be an air conditioner or a blower. The server system can be applied to, for example, a Container Data Center. The Container Data Center is a data center which is formed by mounting a plurality of server systems in a standard container.

The server cabinet 10 is substantially cuboid, and includes a top plate 11, a bottom plate 12 opposite to and parallel to the top plate 11, left and right side plates 13 connecting left and right edges of the top and bottom plates 11, 12 respectively, a front side plate 14 disposed at front sides of the top and bottom plates 11, 12, and a rear side plate 15 disposed at rear sides of the top and bottom plates 11, 12. The top and bottom plates 11, 12, the left and right side plates 13, and the front and rear plates 14, 15 cooperatively form a receiving space 16.

Figure 2:
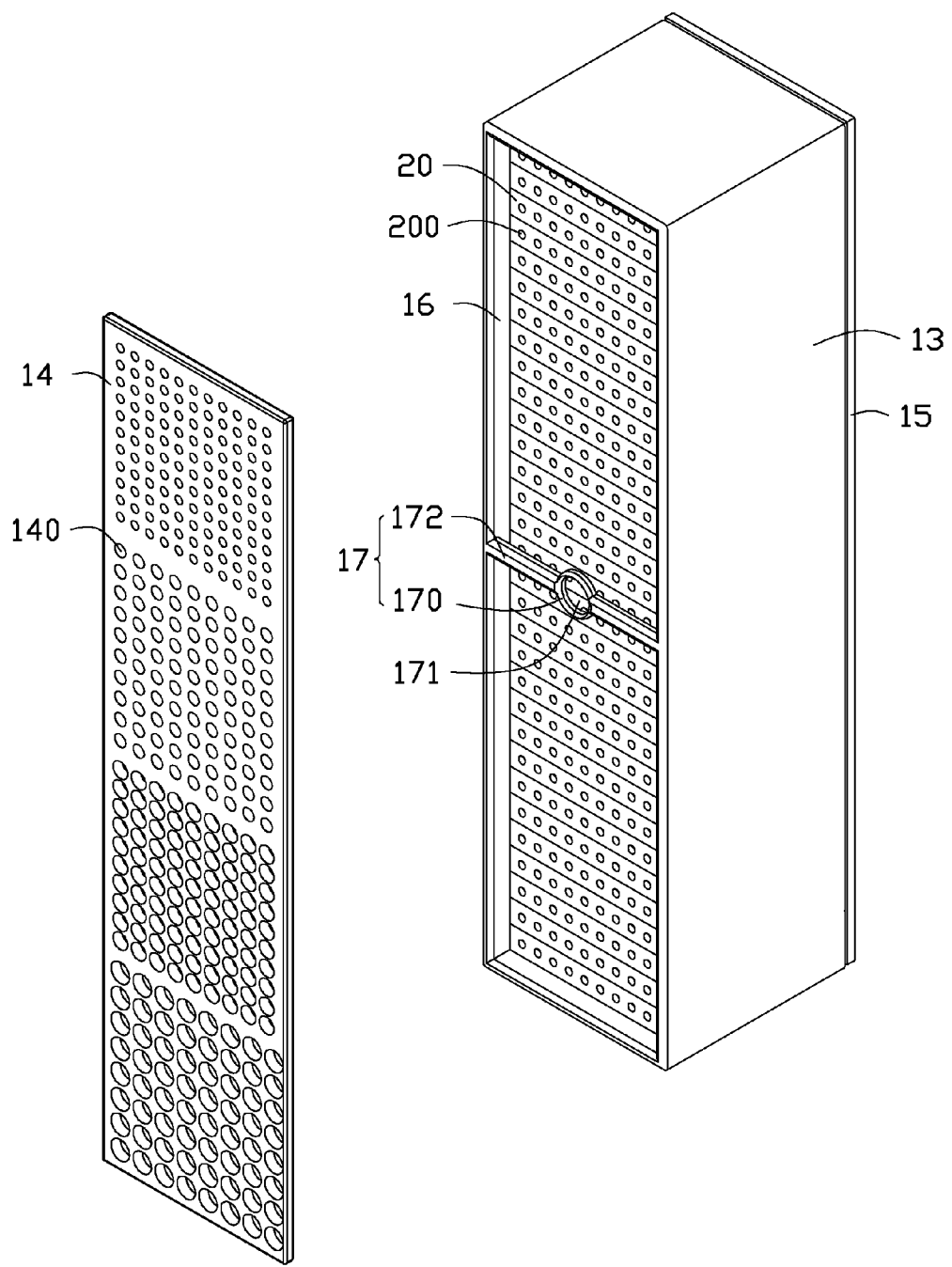
FIG. 2 is an exploded view of the server cabinet of FIG. 1.

Also referring to FIG. 2, a fixing portion 17 is connected between middles of front sides of the left and right side plates 13. The fixing portion 17 includes a supporting portion 170 disposed at a middle, and two strip-shaped connecting portions 172 extending from two sides of the supporting portion 170 to respectively connect the left and right side plates 13. The supporting portion 170 is annular, and defines a circular fixing hole 171 in a center thereof. The supporting portion 170 is parallel to the rear side plate 15.

The front side plate 14 defines a plurality of through holes 140. The through holes 140 are arranged in four matrixes, and the matrixes are arranged in a line along a height direction of the front side plate 14. The through holes 140 in each matrix have the same diameter, and the through holes 140 in any two given matrixes have different diameters. A total area of the through holes 140 in an upper half portion of the front side plate 14 adjacent to the top plate 11 is different from a total area of the through holes 140 in a lower half portion of the front side plate 14 adjacent to the bottom plate 12. The diameters of the through holes 140 of the four matrixes gradually increase from the topmost matrix to the bottommost matrix. As seen in FIG. 4, with the airflow generating device 30 adjacent to the top end of the front side plate 14, the diameter of the through holes 140 of the topmost matrix adjacent to the airflow generating device 30 is smaller than that of the through holes 140 of the bottommost matrix farthest away from the airflow generating device 30. Accordingly, the total area of the through holes 140 in the upper half portion of the front side plate 14 is smaller than the total area of the through holes 140 in the lower half portion of the front side plate 14.

Figure 3:
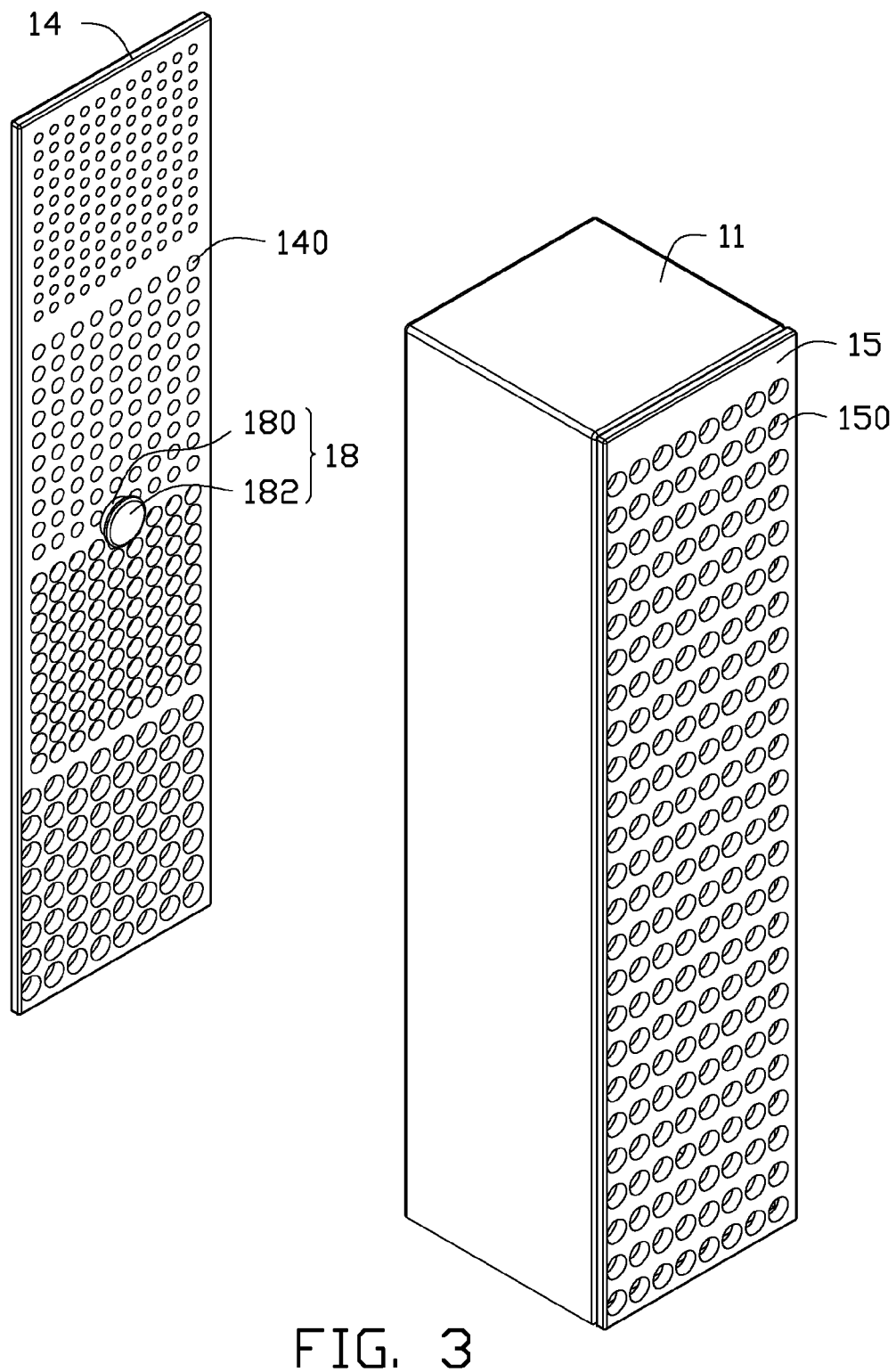
FIG. 3 is an isometric, exploded view of the server cabinet of FIG. 1, seen from another viewpoint.

Also referring to FIG. 3, a pivot 18 is disposed at a rear side of the front side plate 14, corresponding to the fixing hole 171 of the supporting portion 170. The pivot 18 includes a neck portion 180 extending perpendicularly from the front side plate 14, and a head portion 182 disposed at a distal end of the neck portion 180. The neck portion 180 has a diameter substantially equal to that of the fixing hole 171 of the supporting portion 170. The head portion 182 has a diameter larger than the diameter of the neck portion 180. When the front side plate 14 is attached to the fixing portion 17, firstly, the neck portion 180 is extended through the fixing hole 171 of the supporting portion 170. Then the head portion 182 is fixed on the neck portion 180, and is thereby located at a rear side of the supporting portion 170. The front side plate 14 can rotate around the neck portion 180 of the pivot 18 along a plane in which the front side plate 14 is located.

The rear side plate 15 pivotedly connects one of the left and right side plates 13. The rear side plate 15 defines a plurality of through holes 150 arranged in a matrix. The through holes 150 have the same diameter.

Also referring to FIG. 2, the rear side plate 15 is swung open, and the servers 20 are received in the receiving space 16 of the server cabinet 10 and stacked one on another. Each server 20 defines a plurality of through holes 200, corresponding to the through holes 140 of the front side plate 14 and the through holes 150 of the rear side plate 15. A plurality of fans 202 for generating intake airflow are disposed in each server 20.

In use, cold (or cooler) airflow generated by the airflow generating device 30 blows from the top of the server cabinet 10 to the bottom of the server cabinet 10. The air flows through the through holes 140 of the front side plate 14 into the server cabinet 10. The fans 202 suck the airflow through the through holes 200 and exhaust hot airflow out of the servers 20, to thereby dissipate heat from the servers 20. The hot air outside the servers 20 then flows out of the server cabinet 10 via the through holes 150 of the rear side plate 15.

Since the airflow generating device 30 is disposed near the top end of the front side plate 14 of the server cabinet 10, much more airflow can directly blow to the top portion of the server cabinet 10. In addition, since diameters of the through holes 140 of the four matrixes gradually increase from the portion of the front side plate 14 adjacent to the airflow generating device 30 to the portion of the front side plate 14 farthest away from the airflow generating device 30, and since the total area of the through holes 140 in the portion of the front side plate 14 adjacent to the airflow generating device 30 is less than the total area of the through holes 140 in the portion of the front side plate 14 away from the airflow generating device 30, a portion of airflow generated by the airflow generating device 30 and flowing through the through holes 140 adjacent to the airflow generating device 30 is attenuated, and a portion of the airflow generated by the airflow generating device 30 and flowing through the through holes 140 away from the airflow generating device 30 is amplified. Thus, the airflow generated by the airflow generating device 30 can flow toward the servers 20 in the server cabinet 10 more evenly. In particular, the servers 20 away from the airflow generating device 30 can receive more airflow than would otherwise be the case. This improves a heat dissipation efficiency of the server system.

Figure 5:
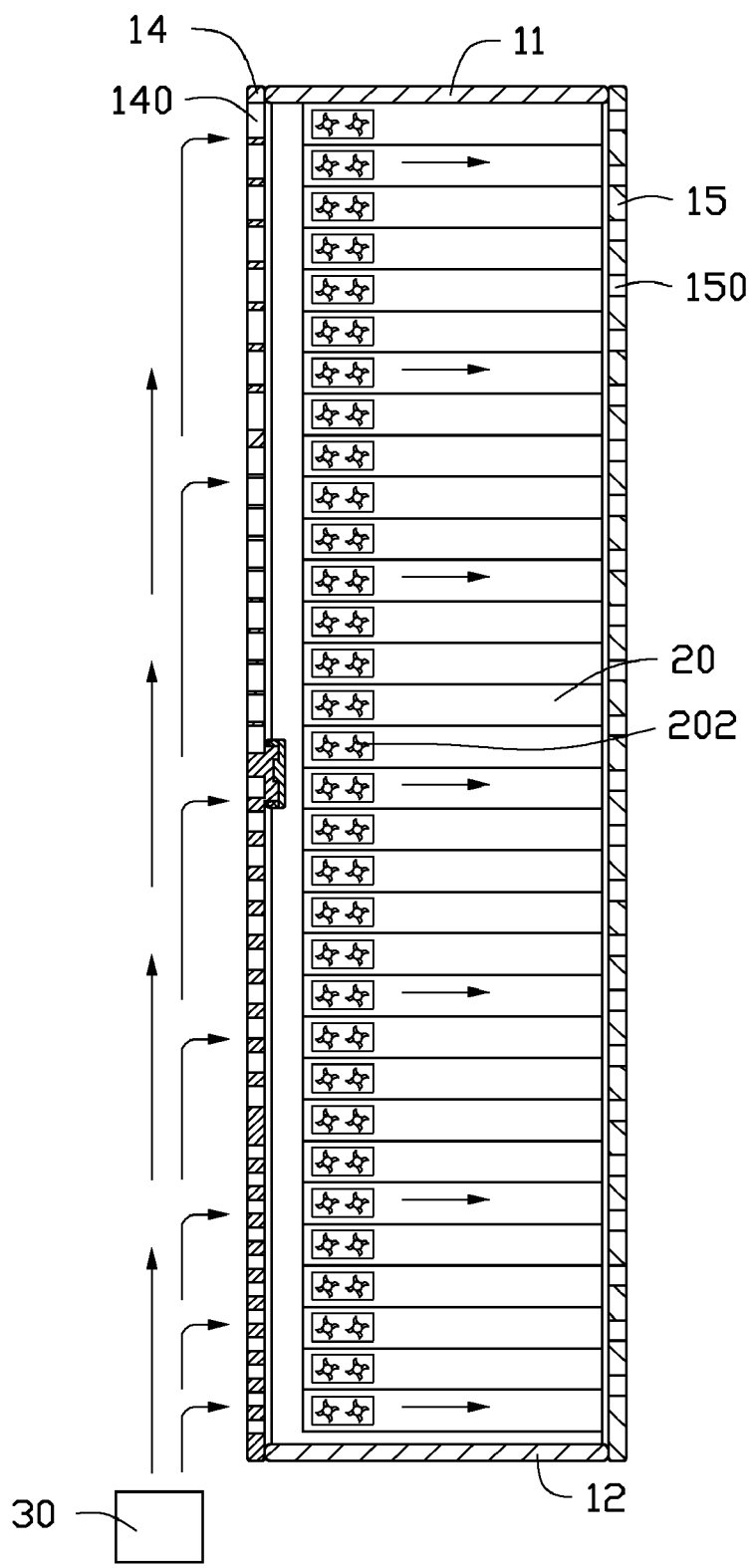
FIG. 5 is similar to FIG. 4, but showing an alternative arrangement wherein the airflow generating device is disposed at a bottom of a server cabinet.

Referring to FIG. 5, in this arrangement, the airflow generating device 30 is instead disposed near a bottom end of the front side plate 14 of the server cabinet 10. Since the front side plate 14 of the server cabinet 10 can rotate around the neck portion 180 of the pivot 18, to achieve the arrangement of FIG. 5, the top portion of the front side plate 14 as viewed in FIGS. 1-4 can reach the bottom of the server cabinet 10 by rotating the front side plate 14 180 degrees. When the arrangement of FIG. 5 is thus achieved, the diameters of the four matrixes of the through holes 140 of the front side plate 14 gradually increase from a portion of the front side plate 14 adjacent to the airflow generating device 30 to a portion of the front side plate 14 farthest away from the airflow generating device 30. A total area of the through holes 140 in a lower half portion of the front side plate 14 adjacent to the airflow generating device 30 is less than a total area of the through holes 140 in an upper half portion of the front side plate 14 away from the airflow generating device 30.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A server cabinet adapted for receiving a plurality of servers therein, the server cabinet comprising:
   a top plate, and a bottom plate parallel to the top plate;
   a left side plate and a right side plate connecting with the top and bottom plates respectively; and
   a front side plate disposed between the top and bottom plates, the front side plate defining a plurality of through holes therein, a total area of the through holes in an upper half portion of the front side plate being different from a total area of the through holes in a lower half portion of the front side plate, the front side plate being rotatable about its center in a plane in which the front side plate is located.

2. The server cabinet of claim 1, wherein the through holes are arranged in a plurality of matrixes along a height direction of the front side plate, the through holes in each matrix having the same diameter, the through holes in different matrixes having different sizes of diameters.

3. The server cabinet of claim 2, wherein the diameter of each through hole in the upper half portion of the front side plate adjacent to the top plate is smaller than the diameter of each through hole in the lower half portion of the front side plate adjacent to the bottom plate.

4. The server cabinet of claim 2, wherein the diameters of the through holes gradually increase from the upper half portion of the front side plate adjacent to the top plate to the lower half portion of the front side plate adjacent to the bottom plate.

5. The server cabinet of claim 1, further comprising a rear side plate disposed at rear sides of the top and bottom plates and defining a plurality of through holes therein, the front plate being disposed at front sides of the top and bottom plates.

6. The server cabinet of claim 5, wherein the through holes in the rear side plate has a same diameter.

7. The server cabinet of claim 1, further comprising a fixing portion connected between the left and right side plates, and a pivot being formed at the front side plate, the fixing portion defining a fixing hole therein, the pivot being pivotally connected in the fixing hole, the front side plate being rotatable relative to the fixing portion.

8. The server cabinet of claim 7, wherein the fixing portion comprises an annular supporting portion disposed at a middle, and two strip-shaped connecting portions extending from two sides of the supporting portion to respectively connect the left and right side plates, the fixing hole being defined in the supporting portion.

9. A server system comprising:
   a server cabinet comprising:
      a top plate and a bottom plate opposite to the top plate;
      a left side plate and a right side plate connecting with the top and bottom plates respectively; and
      a front side plate disposed between the top and bottom plates, the front side plate defining a plurality of through holes therein, a total area of the through holes in an upper half portion of the front side plate being different from a total area of the through holes in a lower half portion of the front side plate, the front side plate being rotatable about its center in a plane in which the front side plate is located;
   a plurality of servers received in the server cabinet and stacked one on another; and
   an airflow generating device configured for generating airflow, the airflow generating device selectively disposed either near a top end of the front side plate of the server cabinet or near a bottom end of the front side plate of the server cabinet.

10. The server system of claim 9, wherein the through holes are arranged in a plurality of matrixes along a height direction of the front side plate, the through holes in each matrix having the same diameter, the through holes in different matrixes having different sizes of diameters.

11. The server system of claim 10, wherein the diameter of each through hole in the upper half portion of the front side plate adjacent to the top plate is smaller than the diameter of each through hole in the lower half portion of the front side plate adjacent to the bottom plate.

12. The server system of claim 10, wherein the diameters of the through holes gradually increase from the upper half portion of the front side plate adjacent to the top plate to the lower half portion of the front side plate adjacent to the bottom plate.

13. The server system of claim 9, further comprising a rear side plate disposed at rear sides of the top and bottom plates and defining a plurality of through holes therein, the front plate being disposed at front sides of the top and bottom plates.

14. The server system of claim 13, wherein the through holes in the rear side plate has a same diameter.

15. The server system of claim 13, wherein the rear side plate pivotedly connects one of the left and right side plates.

16. The server system of claim 9, wherein the server cabinet further comprises a fixing portion connected between the left and right side plates, and a pivot being formed at the front side plate, the fixing portion defining a fixing hole therein, the pivot being pivotally connected in the fixing hole, the front side plate being rotatable relative to the fixing portion.

17. The server system of claim 16, wherein the fixing portion comprises an annular supporting portion disposed at a middle, and two strip-shaped connecting portions extending from two sides of the supporting portion to respectively connect the left and right side plates, the fixing hole being defined in the supporting portion.

18. The server system of claim 9, wherein at least one fan for absorbing airflow is disposed in each of the servers.

19. The server system of claim 18, wherein each server defines a plurality of through holes corresponding to the through holes of the front side plate and the through holes of the rear side plate.

20. The server system of claim 9, wherein the airflow generating device is an air conditioner.

* * * * *